(12) United States Patent
Gong et al.

(10) Patent No.: US 6,205,013 B1
(45) Date of Patent: Mar. 20, 2001

(54) MULTI-LAYER METALLIZATION CAPACITIVE STRUCTURE FOR REDUCTION OF THE SIMULTANEOUS SWITCHING NOISE IN INTEGRATED CIRCUITS

(75) Inventors: Jeng Gong, Hsinchu; Jiann-Shiun Torng, Taichung; Sheng-Hsing Yang, Hsinchu, all of (TW)

(73) Assignee: United Micrelectronics Corp., Hsinchu (TW)

( * ) Notice: Subject to any disclaimer, the term of this patent is extended or adjusted under 35 U.S.C. 154(b) by 0 days.

(21) Appl. No.: 09/055,774

(22) Filed: Apr. 6, 1998

(30) Foreign Application Priority Data

Feb. 13, 1998 (TW) .................................................. 87102003

(51) Int. Cl.[7] ............................. H01G 4/228; H01G 4/30; H01G 4/06
(52) U.S. Cl. .................................... 361/306.1; 361/301.4; 361/301.2; 361/311
(58) Field of Search ............................. 361/301.1, 301.2, 361/301.3, 301.4, 303, 306.1, 311, 312, 313

(56) References Cited

U.S. PATENT DOCUMENTS

| | | | |
|---|---|---|---|
| 4,811,082 | * 3/1989 | Jacobs et al. | 357/80 |
| 5,155,655 | * 10/1992 | Howard et al. | 361/303 |
| 5,161,086 | * 11/1992 | Howard et al. | 361/321 |
| 5,469,324 | * 11/1995 | Henderson et al. | 361/301.2 |
| 5,583,739 | * 12/1996 | Vu et al. | 361/313 |
| 5,635,767 | * 6/1997 | Wenzel et al. | 257/778 |
| 5,672,911 | * 9/1997 | Patil et al. | 257/691 |
| 5,708,296 | * 1/1998 | Bhansali | 257/698 |
| 5,870,274 | * 2/1999 | Lucas | 361/311 |
| 5,886,406 | * 3/1999 | Bhansali | 257/698 |

* cited by examiner

Primary Examiner—Kristine Kincaid
Assistant Examiner—Eric Thomas

(57) ABSTRACT

A multi-layer metallization capacitive structure is provided to a conductive line, such as a power line or signal transmission line in an integrated circuit, where the undesired effect of simultaneous switching noise (SSN) is adverse due to rapid switching of pulses in a digital signal. The multi-layer metallization capacitive structure can help reduce the SSN effect in the integrated circuit by providing at least one metallization layer which extends substantially beneath the conductive line; and at least one dielectric layer sandwiched between the power line and the metallization layer. The multi-layer metallization capacitive structure has an optimal effect if the metallization layer is designed to be precisely equal in width to the power line. The multi-layer metallization capacitive structure has an advantage over the prior art in that it can be formed together with the processing for forming multiple interconnects in the integrated circuit without the need to devise additional processes. Moreover, it requires a reduced layout area to implement as compared to the conventional on-chip capacitor.

12 Claims, 5 Drawing Sheets

MULTI-LAYER METALLIZATION CAPACITIVE STRUCTURE FOR REDUCTION OF THE SIMULTANEOUS SWITCHING NOISE IN INTEGRATED CIRCUITS

CROSS-REFERENCE TO RELATED APPLICATION

This application claims the priority benefit of Taiwan application serial no. 87102003, filed Feb. 13, 1998, the full disclosure of which is incorporated herein by reference.

BACKGROUND OF THE INVENTION

1. Field of the Invention

This invention relates to noise reduction means in integrated circuits, and more particularly, to a multi-layer metallization capacitive structure which can help reduce the simultaneous switching noise (SSN) due to rapid switching of pulses in a digital signal.

2. Description of Related Art

The SSN effect is caused by the rapid switching of the pulses in a digital signal due to the inductance of the conductive line or the ground line. FIG. 1 shows a CMOS inverter in which the SSN effect is a problem. As shown, the CMOS inverter includes a PMOS transistor (P-type metal-oxide semiconductor transistor) 10 and an NMOS transistor (N-type metal-oxide semiconductor transistor) 12. The gate of the PMOS transistor 10 and the gate of the NMOS transistor 12 are tied together and connected to the input port for receiving a stream of pulses representative of digital data or signals. The source of the PMOS transistor 10 is connected via a power line 18 and a first inductor 14 to a system voltage $V_d$, where, for example, $V_d$=5 V (volt). The source of the NMOS transistor 12 is connected via a ground line and a second inductor 16 to the ground. Further, the drain of the PMOS transistor 10 and the drain of the NMOS transistor 12 are tied together and connected to the output port of the inverter.

One drawback to the foregoing circuit, however, is that when the pulses in the input signal are switched from one state to the other, an instantaneous current will be induced to flow either through the first inductor 14 to the system voltage line or through the second inductor 16 to the ground. A high voltage is thus induced across the power line 18 due to the instantaneous change in the current. This can be represented by the following relationship:

$$\Delta V = L \cdot dI/dt.$$

where $\Delta V$ is the induced voltage;

L is the inductance of the power line; and dI/dt is the rate of change of the instantaneous current.

The induced high voltage from the power line would then influence the neighboring circuits that are connected to the inverter. The influence from such a high voltage is particularly adverse in integrated circuits of high packing densities and small sizes; high voltage can corrupt the digital data that are processed by the integrated circuits.

One solution to the foregoing problem, as shown in FIG. 1, is to provide a so-called on-chip capacitor 15 across the source and drain of the NMOS transistor 12 to offset the inductance of the conductive line connected to the ground. This provision can suppress the instantaneous current to a lesser degree. A conventional structure for forming the on-chip capacitor 15 in an integrated circuit is depicted in the following with reference to FIG. 2.

In FIG. 2, the reference numeral 20 designates a power line or a ground line where the problem of the SSN effect is serious. As shown, the on-chip capacitor 15 includes a first metallization layer 22 connected to the power line or the ground line 20, a second metallization layer 24 formed beneath the first metallization layer 22, and a dielectric layer 26 sandwiched between the first and second metallization layers 22, 24.

The foregoing on-chip capacitor structure has two major drawbacks. First, it takes quite a large layout space in the integrated circuit, which is cost-ineffective for the manufacture of integrated circuits. Second, since the level of SSN is difficult to precisely predict in advance, if the on-chip capacitor fails to suppress the SSN effect, the whole layout should be redesigned. This makes the manufacture of the integrated circuits even more cost-ineffective.

SUMMARY OF THE INVENTION

It is therefore an objective of the present invention to provide a multi-layer metallization capacitive structure, which can help reduce the simultaneous switching noise in an integrated circuit.

It is another objective of the present invention to provide a multi-layer metallization capacitive structure, which will take up a lesser layout space in the integrated circuit as compared to the prior art.

In accordance with the foregoing and other objectives of the present invention, an improved multi-layer metallization capacitive structure is provided. The multi-layer metallization capacitive structure of the invention includes a power line, at least one metallization layer which extends substantially beneath the power line and at least one dielectric layer sandwiched between the power line and the metallization layer. The multi-layer metallization capacitive structure can provide the optimal effect if the metallization layer is designed to be precisely equal in width to the power line.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In the following detailed description, the invention is embodied as a double-layer metallization capacitive structure. However, it is to be understood that the invention is not limited to such a structure, and instead can be extended to three or more layers.

Figure 1:
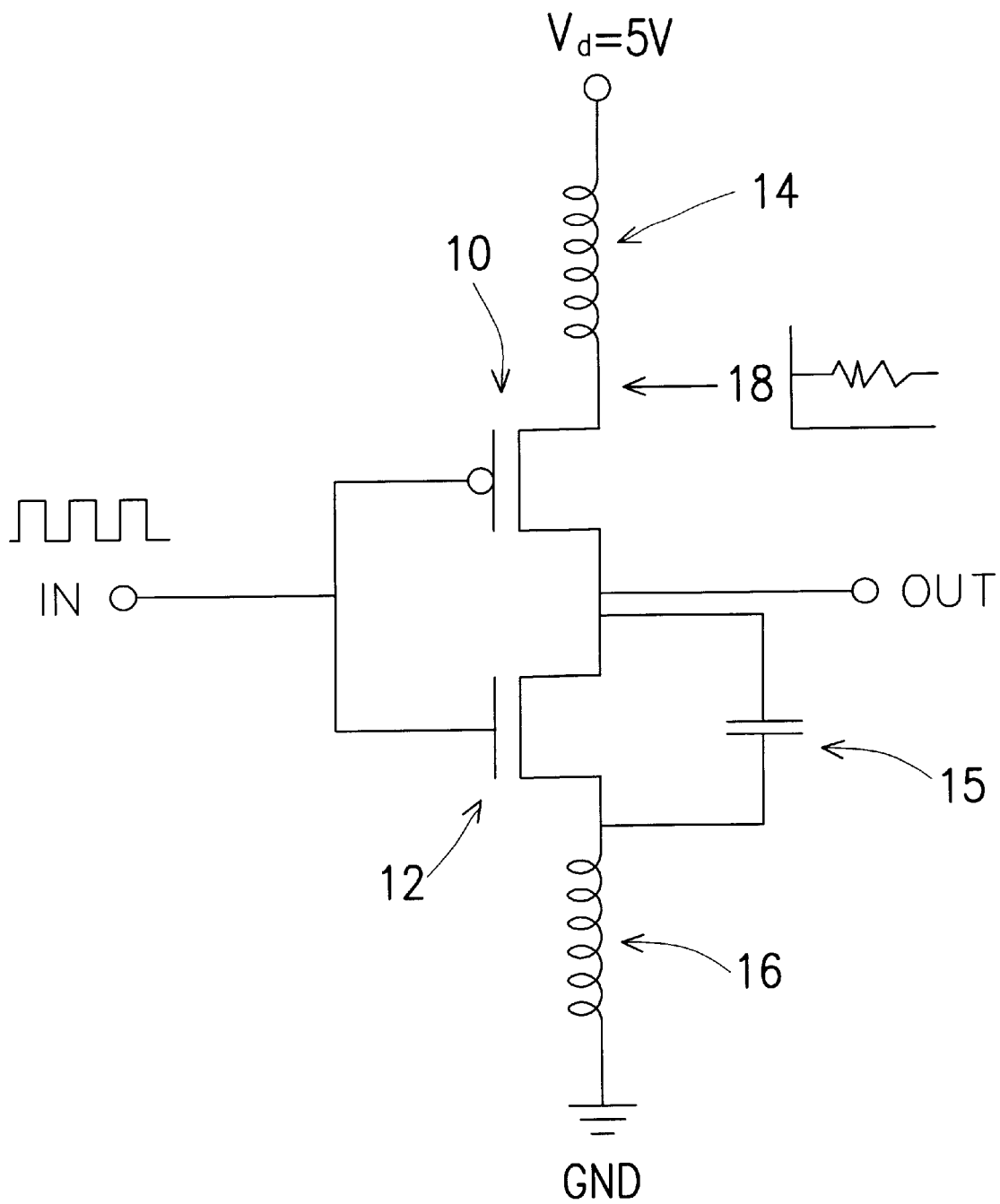
FIG. 1 is a schematic diagram of a CMOS inverter circuit, which is used to depict the SSN effect due to pulse switching.
Figure 2:
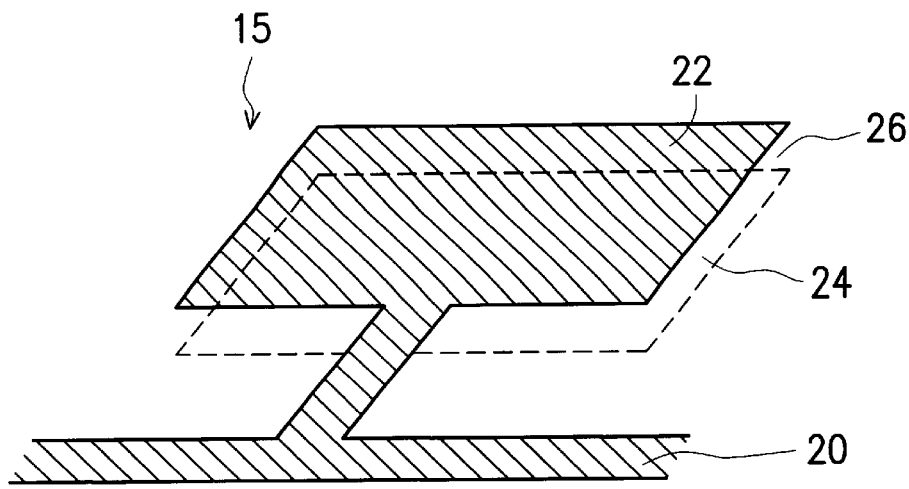
FIG. 2 is a schematic diagram showing the conventional structure of an on-chip capacitor used to suppress the SSN effect.
Figure 3:
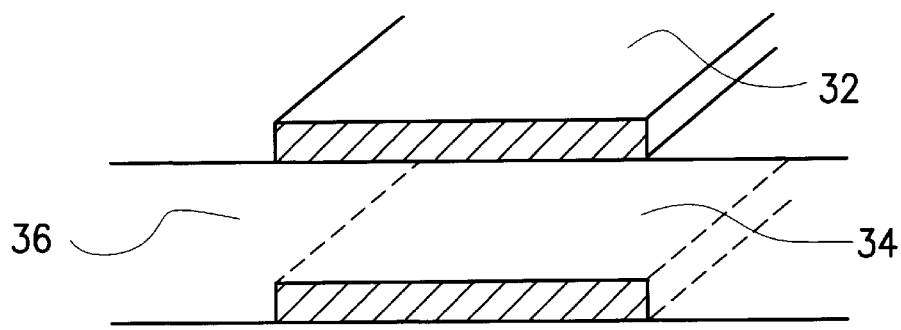
FIG. 3 is a schematic diagram of a preferred embodiment of the multi-layer metallization capacitive structure according to the invention, which is embodied as a double-layer structure to suppress SSN effect in an integrated circuit.

FIG. 3 is a schematic diagram showing a double-layer metallization capacitive structure according to the invention, which can help reduce the SSN effect in an integrated circuit. As shown, the double-layer metallization capacitive structure is provided beneath a power line or a ground line 32 (which is formed from a flat metallization layer), which includes a metallization layer 34 equal in width to the power line or the ground line 32 and a dielectric layer 36 sandwiched between the power line or the ground line 32 and the metallization layer 34. The metallization layer 34 can be formed from aluminum, for example. The dielectric layer 36 can be formed from oxide, for example. In combination, the power line or the ground line 32, the dielectric layer 36, and the metallization layer 34 constitute a double-layer capacitive structure which can serve to offset the inductance of the power line or the ground line 32, thereby reducing the current drift due to the switching of pulses in the digital signal processed by the integrated circuit. The drawbacks of the prior art can thus be improved.

Figure 4:
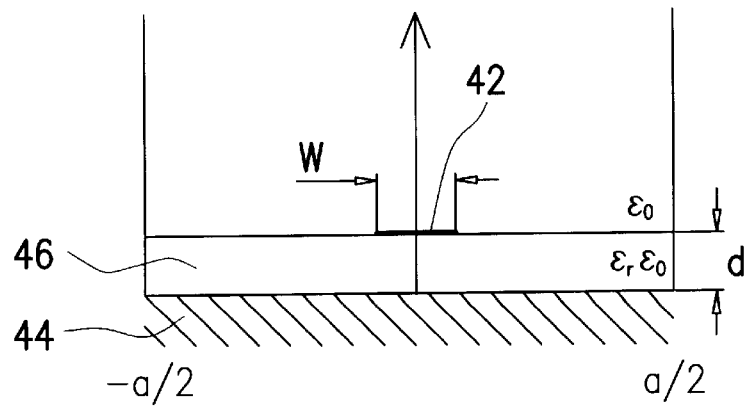
FIG. 4 is a schematic diagram used to depict the method of finding the optimal structure for the double-layer metallization capacitive structure of FIG. 3.

FIG. 4 is a schematic diagram used to depict the method of finding the optimal structure for the double-layer metallization capacitive structure of FIG. 3. In this figure, the reference numeral 42 designates an upper metallization layer, the reference numeral 44 designates a grounded metallization layer and the reference numeral 46 designates a dielectric layer sandwiched between the upper metallization layer 42 and the grounded metallization layer 44. Assume the power line or the ground line 32 has a width W, the grounded metallization layer 44 has a width a, the dielectric layer 46 has a thickness d, the dielectric constant of the medium above the power line or the ground line 32 is $\epsilon_0$ and the dielectric constant of the dielectric layer 46 is $\epsilon_r\epsilon_0$. Further, assume the upper metallization layer 42 is centered above the grounded metallization layer 44, with the center thereof being the original, making the rightmost edge of the grounded metallization layer 44 at the coordinate a/2 and the leftmost edge of the same at the coordinate -a/2.

Based on the above assumptions, the following relationship can be deduced:

$$C = Q/V$$

$$= \frac{1}{\sum_{\substack{n=1 \\ odd}}^{\infty} \frac{4a\sin(n\pi W/2a)\sinh(n\pi d/a)}{(n\pi)^2 W\varepsilon_0[\sinh(n\pi d/a) + \varepsilon_r\cosh(n\pi d/a)]}} \quad (1)$$

where $$\epsilon_0 = C/C_0$$

Therefore, the characteristic impedance $Z_0$ of the upper metallization layer 42 (when serving as a power line) can be expressed as follows:

$$Z_0 = \frac{\sqrt{\varepsilon_e}}{c \cdot C}$$

where $c = 3 \times 10^8$ m/sec

From Eqn. (1), it can be found that the capacitance per unit length of the power line is at the maximum when the upper metallization layer 42 and the grounded metallization layer 44 are equal in width. Accordingly, as illustrated in FIG. 3, the metallization layer 34 is designed to have its width substantially equal to that of the power line or the ground line 32 so as to provide the best capacitance to offset the inductance of the power line or the ground line 32.

The improvements provided by the double-layer metallization capacitive structure of the invention are demonstrated in the following with reference to FIGS. 5A–5B and FIGS. 6A–6D.

Figure 5A:
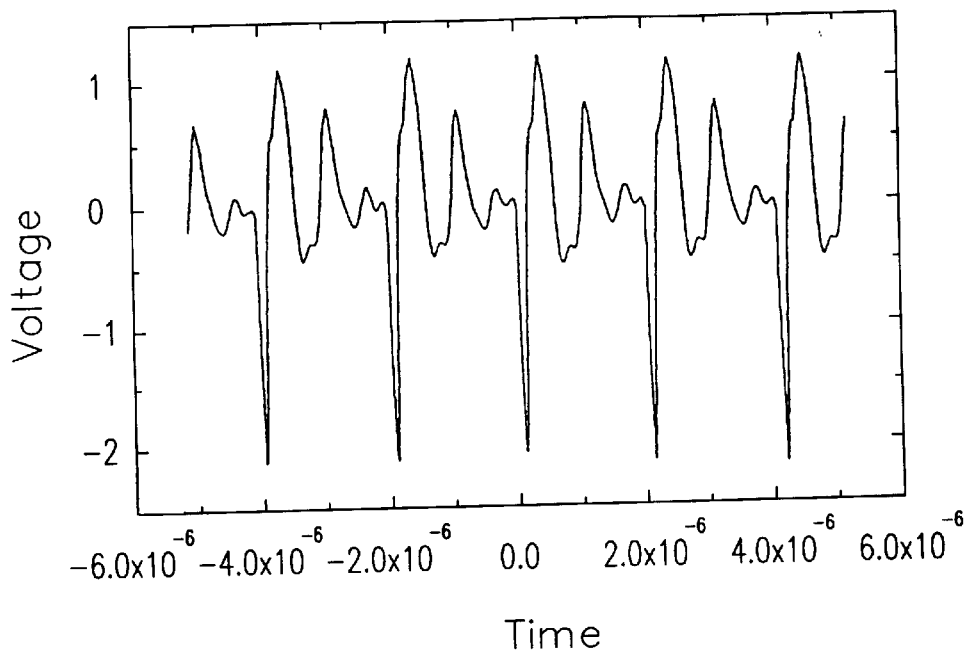
FIG. 5A is a graph, showing the waveform of a pulsed signal applied to an integrated circuit that is not provided with the double-layer metallization capacitive structure of the invention.
Figure 5B:
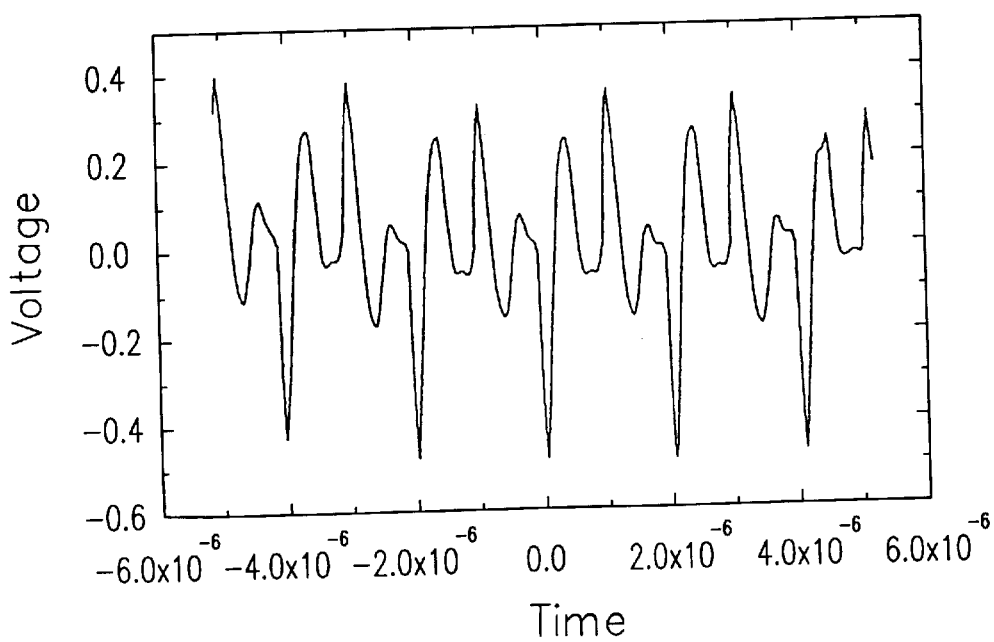
FIG. 5B is a graph, showing the waveform of the same pulsed signal used in the case of FIG. 5A with the pulsed signal being applied to an integrated circuit provided with the double-layer metallization capacitive structure of the invention.
Figure 6A:
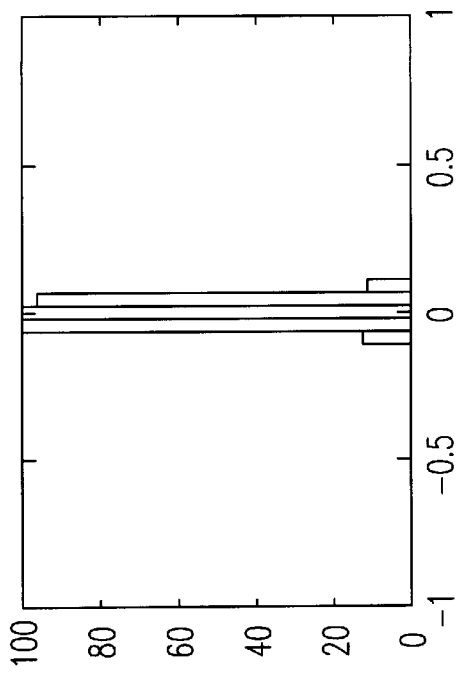
FIG. 6A is a graph of simulation result, showing the SSN of a single-layer metallization capacitive structure ($Z_0 = 88.3452\Omega$)
Figure 6B:
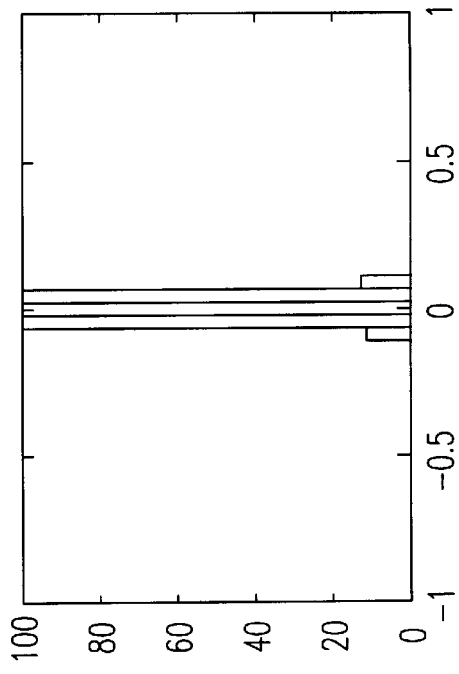
FIG. 6B is a graph of simulation result, showing the SSN of a double-layer metallization capacitive structure ($Z_0 = 40.645\Omega$)
Figure 6C:
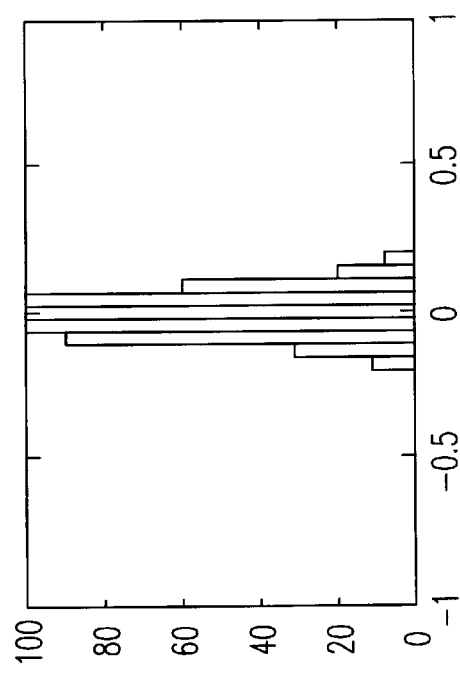
FIG. 6C is a graph of simulation result, showing the SSN of a single-layer metallization capacitive structure whose surface area is the same as the conventional on-chip capacitor ($C_0 = 66.5$ fF)
Figure 6D:
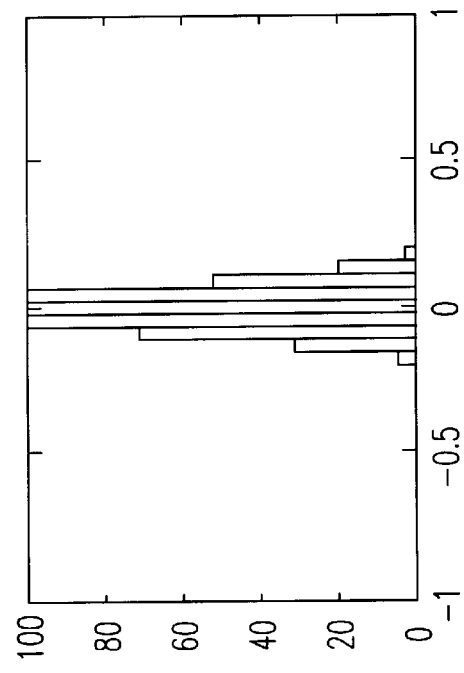
FIG. 6D is a graph of simulation result, showing the SSN of a double-layer metallization capacitive structure whose surface area is the same as the conventional on-chip capacitor ($C_0 = 5$ pF)

FIG. 5A is a graph showing the waveform of a pulsed signal applied to an integrated circuit that is not provided with the double-layer metallization capacitive structure of the invention. For comparison purpose, FIG. 5B shows the same for an integrated circuit that is provided with the double-layer metallization capacitive structure of the invention. It can be seen from FIG. 5A that, without the provision of the invention, the waveform of the pulsed signal, when passing through the power line, will undulate between a maximum of about 1 V and a minimum of about −2 V. By contrast, as shown in FIG. 5B, the invention will only allow the same pulsed signal to undulate between a maximum of about 0.4V and a minimum of about −0.4 V. The undulation range is therefore considerably reduced as compared to the prior art.

FIGS. 6A–6D are graphs, showing the respective simulation results for a single-layer metallization capacitive structure with $Z_0 = 88.3452\Omega$, a double-layer metallization capacitive structure with $Z_0 = 40.645\Omega$, a metallization capacitive structure with $C_0 = 66.5$ fF (femtofarad) and whose surface area is the same as the conventional on-chip capacitor and a metallization capacitive structure with $C_0 = 5$ pF (picofarad) and whose surface area is the same as the conventional on-chip capacitor. It can be seen from these graphs that the invention can allow a decreased characteristic impedance $Z_0$ and an increased capacitance $C_0$ for the power line.

In conclusion, the multi-layer metallization capacitive structure of the invention can reduce the SSN effect due to the switching of pulses in a digital signal. With the same surface area, the multi-layer metallization capacitive structure of the invention can provide a larger capacitance than the conventional on-chip capacitor. In the foregoing disclosure, the preferred embodiment is a double-layer structure; but the invention can be extended to three or more layers.

Figure 7:
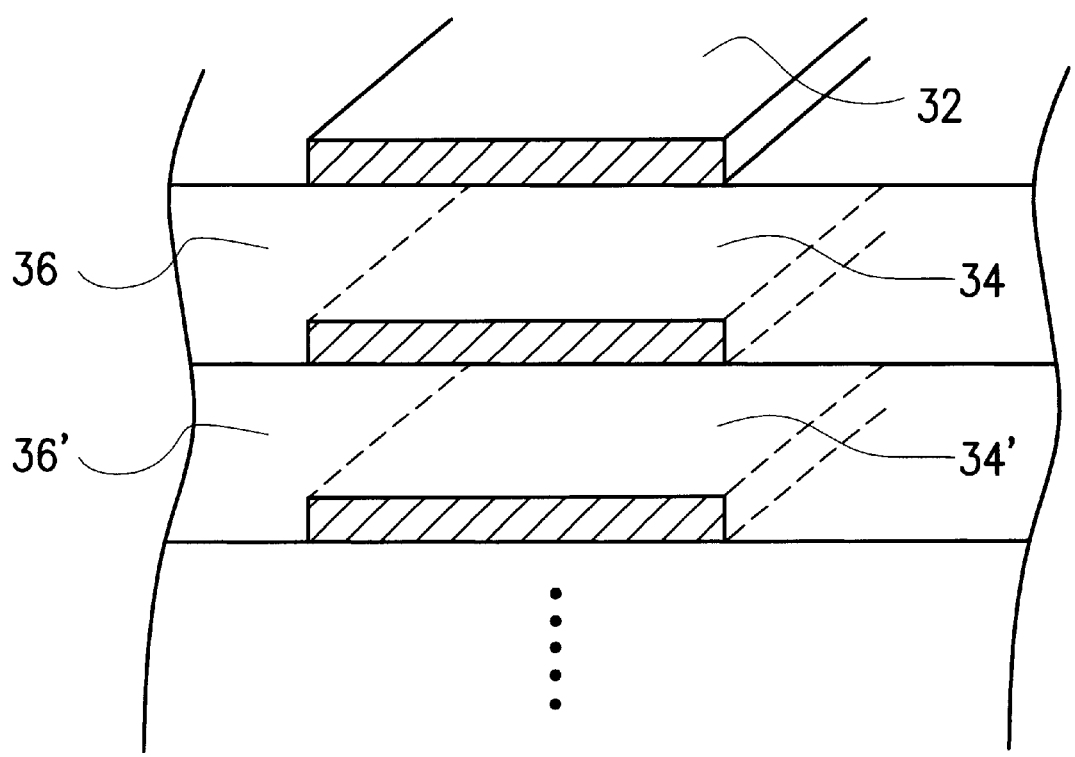
FIG. 7 is a schematic diagram showing a multi-layer metallization capacitive structure according to the invention, which can reduce the SSN effect in an integrated circuit.

FIG. 7 is a schematic diagram showing a multi-layer metallization capacitive structure according to the invention, which can help reduce the SSN effect in an integrated circuit. The number signs here are the same as in FIG. 3. As shown, the multilayer metallization capacitive structure is provided beneath a power line or a ground line 32 (which is formed from a flat metallization layer), which includes several metallization layers 34 and 34' equal in width to the power line or the ground line 32 and dielectric layers 36 and 36'. The dielectric layer 36 is sandwiched between the power line or the ground line 32 and the metallization layer 34. The dielectric layer 36' is sandwiched between the metallization layer 34 and the metallization layer 34'. The metallization layers 34 and 34' can be formed from aluminum, for example. The dielectric layers 36 and 36' can be formed from oxide, for example.

The multi-layer metallization capacitive structure of the invention can be formed together by the process for forming multiple interconnects in an integrated circuit. Therefore, the fabrication of the multi-layer metallization capacitive structure requires no additional processes. In practice, a simulation test can be performed on the integrated circuit to find those power lines that are particularly adversely affected by the SSN effect; and then these power lines are replaced with the multi-layer metallization capacitive structure of the invention so as to reduce the SSN effect.

The invention has an advantage over the prior art in that it can be implemented without the need to take up additional layout space in the integrated circuit. Moreover, the power lines that are subjected to SSN can be detected in advance and then replaced with the multi-layer metallization capacitive structure of the invention to reduce the SSN effect. The manufacture of the integrated circuits is therefore much more cost-effective than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-layer metallization capacitive structure for reduction of simultaneous switching noise (SSN) effect in an integrated circuit, which comprises:

a power line;

at least one metallization layer which extends substantially beneath said power line, wherein the power line is substantially equal in width to that of the at least one metallization layer; and at least one dielectric layer sandwiched between said power line and said metallization layer.

2. The multi-layer metallization capacitive structure of claim 1, wherein said power line is connected to a DC voltage.

3. The multi-layer metallization capacitive structure of claim 1, wherein said metallization layer is formed from aluminum.

4. The multi-layer metallization capacitive structure of claim 1, wherein said metallization layer is formed together with a process for forming multiple interconnects in the integrated circuit.

5. The multi-layer metallization capacitive structure of claim 1, wherein said dielectric layer is formed from oxide.

6. A multi-layer metallization capacitive structure for reduction of simultaneous switching noise (SSN) effect in an integrated circuit, which comprises:

a conductive line;

a plurality of metallization layers which extend substantially beneath said conductive line in a stacked manner, each of said metallization layers is substantially equal in width to said conductive line; and a plurality dielectric layers, one of said dielectric layers is sandwiched between said conductive line and one of said metallization layers, and all the others of said dielectric layers are sandwiched between other said metallization layers.

7. The multi-layer metallization capacitive structure of claim 6, wherein said conductive layer is connected to a DC voltage.

8. The multi-layer metallization capacitive structure of claim 6, wherein said conductive layer is connected to a system voltage supply.

9. The multi-layer metallization capacitive structure of claim 6, wherein said conductive layer is connected to ground.

10. The multi-layer metallization capacitive structure of claim 6, wherein said metallization layers are formed from aluminum.

11. The multi-layer metallization capacitive structure of claim 6, wherein said metallization layers are formed together by a process for forming multiple interconnects in the integrated circuit.

12. The multi-layer metallization capacitive structure of claim 6, wherein said dielectric layers are formed from oxide.

* * * * *